(12) United States Patent
Kondo et al.

(10) Patent No.: US 9,929,265 B1
(45) Date of Patent: Mar. 27, 2018

(54) SEMICONDUCTOR DEVICE

(71) Applicant: Sanken Electric Co., LTD., Niiza-shi, Saitama (JP)

(72) Inventors: Taro Kondo, Niiza (JP); Shunsuke Fukunaga, Niiza (JP); Shinji Kudo, Niiza (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 0 days.

(21) Appl. No.: 15/494,222

(22) Filed: Apr. 21, 2017

(51) Int. Cl.
*H01L 29/423* (2006.01)
*H01L 29/78* (2006.01)
*H01L 29/861* (2006.01)
*H01L 29/36* (2006.01)

(52) U.S. Cl.
CPC .......... *H01L 29/7804* (2013.01); *H01L 29/36* (2013.01); *H01L 29/4236* (2013.01); *H01L 29/8611* (2013.01)

(58) Field of Classification Search
CPC . H01L 29/7804; H01L 29/36; H01L 29/4236; H01L 29/8611
See application file for complete search history.

(56) References Cited

U.S. PATENT DOCUMENTS 8,080,858 B2 * 12/2011 Hirler ................ H01L 29/0623
257/329
2016/0013311 A1 1/2016 Nelle et al.

* cited by examiner

*Primary Examiner* — David Vu
(74) *Attorney, Agent, or Firm* — Banner & Witcoff, Ltd.

(57) ABSTRACT

A semiconductor device includes: three or more transistors, which are formed on a semiconductor substrate and arranged in one direction; and a PN junction diode, which is formed in a part of a region between the transistors, wherein the transistor includes: a trench, which is formed inwardly from a front surface; and a conductive region in the trench; wherein a first trench is a trench of the transistor which is not adjacent to the PN junction diode, and a second trench is a trench of one or both of the two transistors adjacent to the PN junction diode, wherein a bottom surface of the first trench is formed in a semiconductor region of a first impurity concentration, and wherein a bottom surface of the second trench is formed in a semiconductor region of a second impurity concentration, which is higher than the first impurity concentration.

6 Claims, 5 Drawing Sheets

SEMICONDUCTOR DEVICE

TECHNICAL FIELD

This disclosure generally relates to a semiconductor device and more specifically relates to the structure in which a high withstand voltage can be realized with simple structure.

BACKGROUND

There has been known a semiconductor device such as a power metal-oxide-semiconductor field-effect transistor (MOSFET) or an insulated gate bipolar transistor (IGBT) in which a gate electrode and a gate insulating film are formed on an inner wall of a trench formed in a front surface of a semiconductor substrate.

A semiconductor device is disclosed in US 2016/0013311 in which a PN junction diode is formed between two left transistors and two right transistors out of four transistors arranged in one direction.

SUMMARY

In the configuration of the semiconductor device disclosed in US 2016/0013311, the depth of the trench of the transistor in both ends among the four transistors is deeper than the depth of the trench of the transistor adjacent to the PN junction diode.

According to the configuration, the breakdown occurs in two transistors adjacent to the PN junction diode earlier than that in two transistors at both ends. For this reason, the breakdown current can flow to the PN junction diode, whereby breakdown resistance can be improved.

However, in this semiconductor device, in order to improve the breakdown resistance, it is necessary to design precisely conditions, and the like such as the depth of the trench so that the design cost increases.

This disclosure is to provide a semiconductor device in which a high withstand voltage can be realized with a simple configuration.

This disclosure at least discloses the following configurations.

According to this disclosure, a semiconductor device includes: three or more transistors, which are formed on a semiconductor substrate and arranged in one direction; and a PN junction diode, which is formed in a part of a region between the transistors formed on the semiconductor substrate. The transistor includes: a trench, which is formed inwardly from a front surface of the semiconductor substrate; and a conductive region, which is configured by at least one conductor formed in the trench. A first trench is a trench of the transistor which is not adjacent to the PN junction diode, and a second trench is a trench of one or both of the two transistors which are adjacent to the PN junction diode. A bottom surface of the first trench is formed in a semiconductor region of a first impurity concentration, and a bottom surface of the second trench is formed in a semiconductor region of a second impurity concentration, which is higher than the first impurity concentration.

In the above-described semiconductor device, the second impurity concentration may be equal to or more than 10 times as high as the first impurity concentration.

In the above-described semiconductor device, the semiconductor substrate may include a first epitaxial growth layer of the first impurity concentration formed on a substrate, and a second epitaxial growth layer of the second impurity concentration formed on the first epitaxial growth layer. the bottom surface of the first trench may be located in the first epitaxial growth layer, and the bottom surface of the second trench may located in the second epitaxial growth layer.

In the above-described semiconductor device, the bottom surface of the first trench may be located in an impurity layer of a first conductivity type forming the semiconductor substrate, and the impurity layer may include: a first impurity diffusion region, which has the first conductivity type and the first impurity concentration, formed in the vicinity of the bottom surface of the first trench; and a second impurity diffusion region, which has the first conductivity type and the second impurity concentration, formed in the vicinity of the bottom surface of the second trench.

In the above-described semiconductor device, a peripheral edge in the one direction of each of the first impurity diffusion region and the second impurity diffusion region may be formed in a C-shape in a section.

In the above-described semiconductor device, the bottom surface of the second trench has a larger sharpness than the bottom surface of the first trench.

According to this disclosure, it is possible to provide a semiconductor device in which a high withstand voltage can be improved.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

An embodiment of this disclosure will be described below with reference to the accompanying drawing.

Figure 1:
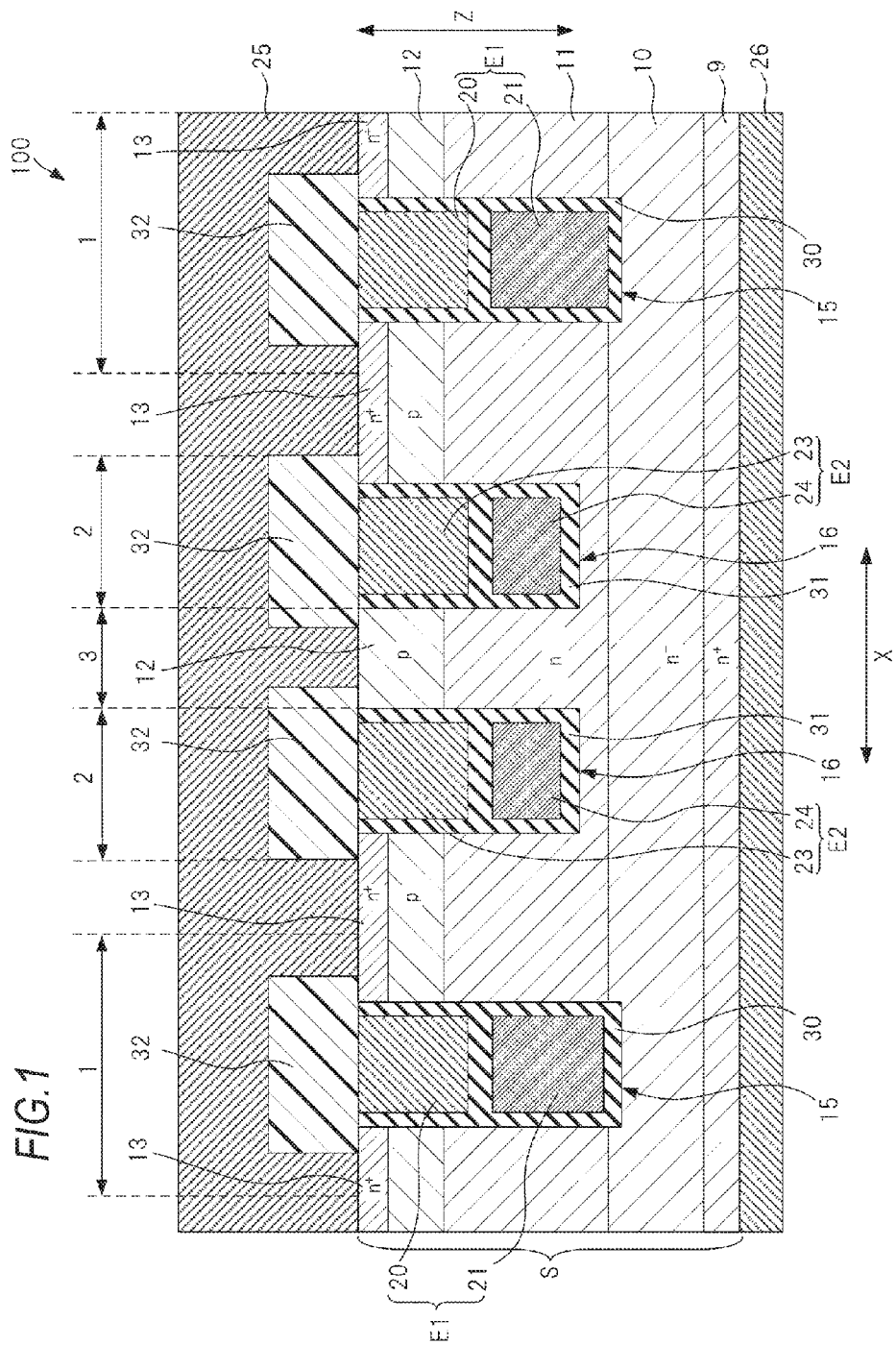
FIG. 1 is a schematic cross-sectional view partially illustrating a schematic configuration of a semiconductor device 100 according to an embodiment of this disclosure.

FIG. 1 is a schematic cross-sectional view illustrating a schematic configuration of a semiconductor device 100 according to an embodiment of this disclosure.

The semiconductor device 100 includes three or more transistors which are arranged in a direction X (one direction) on a semiconductor substrate S (which are exemplified as a plurality of MOSFETs 1 and a plurality of MOSFETs 2 in FIG. 1) and a PN junction diode 3 which is formed in a part of a region between the transistors formed on the semiconductor substrate S (the region between the MOSFETs 2 in FIG. 1). FIG. 1 schematically illustrates a section of the semiconductor device 100 in the direction X.

The semiconductor device 100, as illustrated in FIG. 1, has a configuration in which the two MOSFETs 2 are formed between the two MOSFETs 1 arranged in the direction X, and the PN junction diode 3 is formed between the two MOSFETs 2.

In the semiconductor device 100, as illustrated in FIG. 1, a plurality of sets of two MOSFETs 1, two MOSFETs 2, and one PN junction diode 3 are arranged in the direction X, but at least one set may be provided.

The semiconductor device 100 includes the semiconductor substrate S made of a semiconductor such as silicon, silicon carbide (SiC), or gallium nitride (GaN). The material of the semiconductor substrate S is not limited thereto.

The semiconductor substrate S includes a front surface serving as an upper surface in FIG. 1 and a back surface serving as a lower surface in FIG. 1. In the following description, out of a thickness direction Z being an aligned direction of the back surface and the front surface of the semiconductor substrate S, a direction toward the front surface from the back surface is defined as an upward direction, and a direction toward the back surface from the front surface is defined as a downward direction.

The semiconductor substrate S is configured to include an n-type substrate 9, an n-type first epitaxial growth layer 10 formed by epitaxial growth on the substrate 9, an n-type second epitaxial growth layer 11 formed by epitaxial growth on the first epitaxial growth layer 10, a p-type body region 12 formed on the second epitaxial growth layer 11, and an n-type source region 13 which is formed in a portion of a surface of the body region 12 and has a higher impurity concentration than the first epitaxial growth layer 10 and the second epitaxial growth layer 11. The body region 12 may be configured to have a structure in which a plurality of layers having different impurity concentrations are laminated.

The first epitaxial growth layer 10 has a lower impurity concentration than the substrate 9. The second epitaxial growth layer 11 has a lower impurity concentration than the substrate 9 and has a higher impurity concentration than the first epitaxial growth layer 10.

Further, the semiconductor substrate S includes a first trench 15 that is formed inwardly from the front surface of the semiconductor substrate S (downward from the front surface) and forms a part of the MOSFET 1 and a second trench 16 that is formed inwardly from the front surface of the semiconductor substrate S (downward from the front surface) and forms the MOSFET 2.

The first trench 15 reaches the interior of the first epitaxial growth layer 10 from the front surface of the semiconductor substrate S passing through the second epitaxial growth layer 11 and extends in a direction perpendicular to each of the direction X and the thickness direction Z.

In the first trench 15, a field plate electrode 21 is formed on the back surface of the semiconductor substrate S, and a gate electrode 20 is formed above the field plate electrode 21.

In addition, a first insulating film 30 is formed in a portion of the first trench 15 in which the gate electrode 20 and the field plate electrode 21 are not formed.

The second trench 16 reaches the interior of the second epitaxial growth layer 11 from the front surface of the semiconductor substrate S and extends in a direction perpendicular to each of the direction X and the thickness direction Z.

In the second trench 16, a field plate electrode 24 is formed on the back surface of the semiconductor substrate S, and a gate electrode 23 is formed above the field plate electrode 24.

In addition, a second insulating film 31 is formed in a portion of the second trench 16 in which the gate electrode 23 and the field plate electrode 24 are not formed.

On the front surface of the semiconductor substrate S between the first trench 15 and the second trench 16, the n-type source region 13 is formed, and the p-type body region 12 is formed below the source region 13.

A lower end of each of the gate electrode 20 and the gate electrode 23, which are formed in the first trench 15 and the second trench 16 to hold the body region 12 is located below a lower end of the body region 12.

The p-type body region 12 is formed on the front surface of the semiconductor substrate S between two adjacent second trenches 16. In addition to the body region 12 between the two second trenches 16, the second epitaxial growth layer 11, the first epitaxial growth layer 10, and the substrate 9 which are located below the body region 12, configure the PN junction diode 3.

Further, the semiconductor device 100 also includes a drain electrode 26 made of a metal such as aluminum or a metal alloy that is formed on the back surface of the semiconductor substrate S, an interlayer insulating film 32 including a BPSG (Boron Phosphorus Silicon Glass) film or a PSG film that is formed on the front surface of the semiconductor substrate S and covers the gate electrode 20, the gate electrode 23, a portion of the source region 13, and a portion of the body region 12, and a source electrode 25 made of a metal such as aluminum or a metal alloy that is formed on the front surface of the semiconductor substrate S and a surface of the interlayer insulating film 32.

The source electrode 25 is electrically connected with the source region 13 and the body region 12 exposed on the front surface of the semiconductor substrate S.

The gate electrode 20 in the first trench 15 is connected with a wiring (not illustrated), and a voltage to be applied is controlled. The gate electrode 20 is a conductor made of a conductive material such as a metal, a metal alloy, or a polycrystal semiconductor such as polysilicon.

By controlling the voltage to be applied to the gate electrode 20, a channel is formed in the body region 12 adjacent to the first trench 15, so that charges can be transferred to the drain electrode 26 from the source region 13 adjacent to the first trench 15 through the first epitaxial growth layer 10, the second epitaxial growth layer 11, and the substrate 9.

The field plate electrode 21 in the first trench 15 is connected to the source electrode 25 at the same potential or is in a floating state, and has a function to relax concentration of an electric field in the vicinity of the lower end of the gate electrode 20.

The field plate electrode 21 is a conductor made of a conductive material such as a metal, a metal alloy, or a polycrystal semiconductor such as polysilicon.

The region, in which the gate electrode 20 and the field plate electrode 21 are formed, configures a first conductive region E1.

The first insulating film 30 in the first trench 15 includes an oxide film made of silicon dioxide, a nitride film made of silicon nitride, or a mixed film of the oxide film and the nitride film.

The MOSFET 1 is configured with the gate electrode 20, the field plate electrode 21, and the first insulating film 30 which are formed in the first trench 15, the source region 13 and the body region 12 adjacent to the first trench 15, the first epitaxial growth layer 10, the second epitaxial growth layer 11, and the substrate 9 which are located below the body region 12, the source electrode 25, and the drain electrode 26.

The gate electrode 23 in the second trench 16 is connected with a wiring (not illustrated), and thereby a voltage to be applied is controlled. The gate electrode 23 is a conductor made of a conductive material such as a metal, a metal alloy, or a polycrystal semiconductor such as polysilicon.

The field plate electrode 24 in the second trench 16 is connected to the source electrode 25 at the same potential or is in a floating state, and has a function to relax concentration of an electric field in the vicinity of the lower end of the gate electrode 23.

The field plate electrode 24 is a conductor made of a conductive material such as a metal, a metal alloy, or a polycrystal semiconductor such as polysilicon.

The region in which the gate electrode 23 and the field plate electrode 24 are formed configures a second conductive region E2.

The second insulating film 31 in the second trench 16 includes an oxide film made of silicon dioxide, a nitride film made of silicon nitride, or a mixed film of the oxide film and the nitride film.

The MOSFET 2 is configured with the gate electrode 23, the field plate electrode 24, and the second insulating film 31 which are formed in the second trench 16, the source region 13 and the body region 12 adjacent to the second trench 16, the first epitaxial growth layer 10, the second epitaxial growth layer 11, and the substrate 9 which are located below the body region 12, the source electrode 25, and the drain electrode 26.

In the semiconductor device 100 configured as described above, the extending of a depletion layer is different between the MOSFET 1 and the MOSFET 2 due to difference of impurity concentration in the vicinity of the bottom portion of the trench. Since the MOSFET 2 has a high impurity concentration in the vicinity of the bottom portion of the trench, the depletion layer hardly extends, and thus the breakdown occurs in the MOSFET 2 earlier than that in the MOSFET 1.

At this time, since a breakdown current flows to the PN junction diode 3, breakdown resistance in MOSFET 1 can be improved. In addition, it is possible to realize the effect by only adjusting the impurity concentration of the semiconductor substrate S, and fabricating costs of the device can be reduced.

The difference in the impurity concentration between the first epitaxial growth layer 10 and the second epitaxial growth layer 11 is arbitrary. However, in order to obtain more significantly the effect that the breakdown occurs in the MOSFET 2 earlier than that in the MOSFET 1, the impurity concentration of the second epitaxial growth layer 11 is preferably 10 times or more than that of the first epitaxial growth layer 10.

Figure 2:
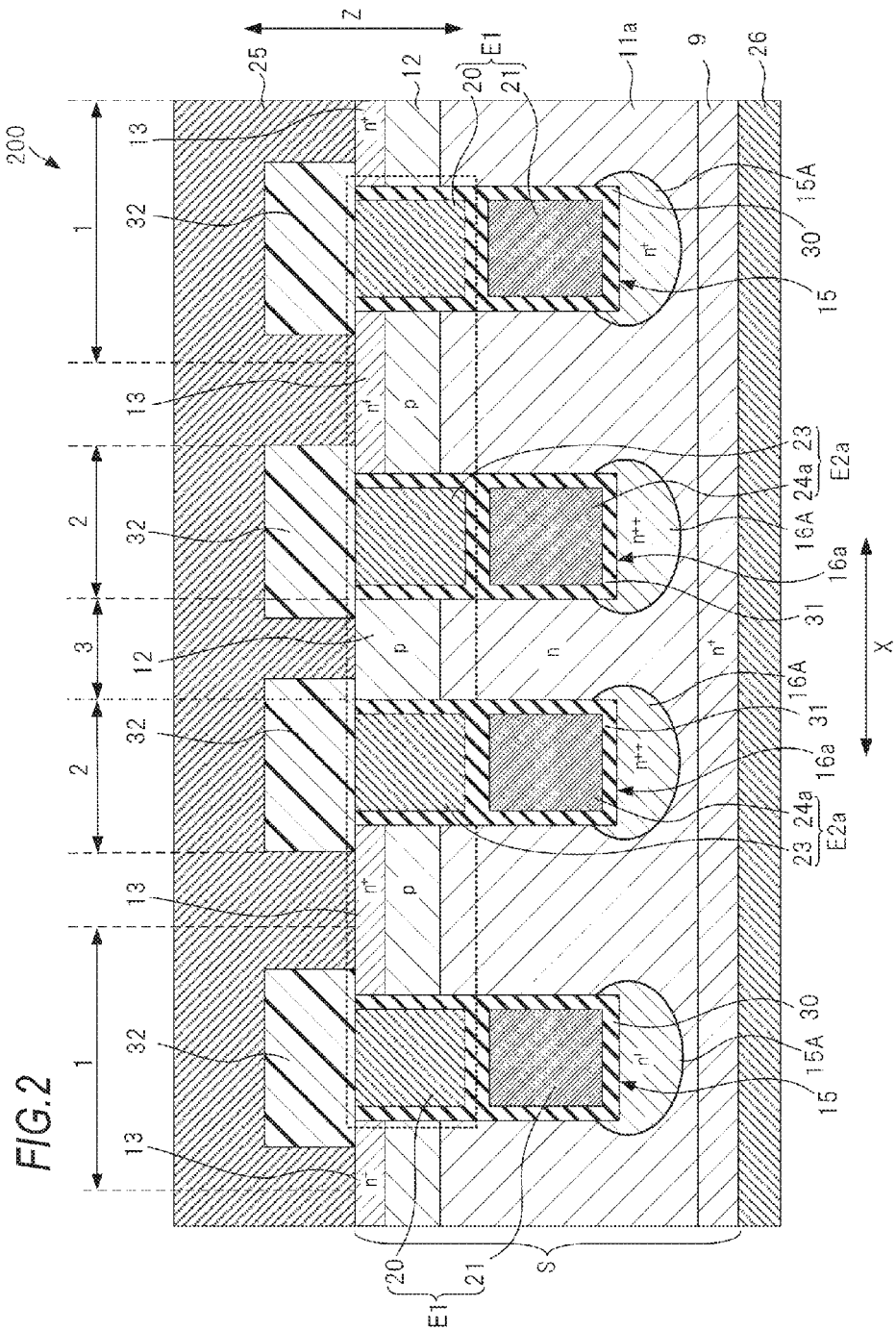
FIG. 2 is a schematic cross-sectional view partially illustrating a schematic configuration of a semiconductor device 200 according to an embodiment of this disclosure.

FIG. 2 is a schematic cross-sectional view illustrating a schematic configuration of a semiconductor device 200 according to an embodiment of this disclosure.

The semiconductor device 200 has a same configuration as the semiconductor device 100 except that the second trench 16 is changed into a second trench 16a, and the first epitaxial growth layer 10 and the second epitaxial growth layer 11 on the semiconductor substrate S are changed into an n-type drift region 11a. In FIG. 2, the same components as in FIG. 1 are denoted by same reference numerals.

The drift region 11a configuring the semiconductor substrate S in semiconductor device 200 is an n-type impurity region formed on the substrate 9 and having a lower impurity concentration than the substrate 9 and is formed by ion implantation or epitaxial growth. On this drift region 11a, the body region 12 is formed.

The second trench 16a reaches the interior of the drift region 11a from the front surface of the semiconductor substrate S. In the second trench 16a, a second conductive region E2a including the gate electrode 23 and the field plate electrode 24a is formed, and the second insulating film 31 is formed in a portion excluding the second conductive region E2a.

The field plate electrode 24a is an electrode in which the width of the field plate electrode 24 illustrated in FIG. 1 is widened in the thickness direction Z.

The first trench 15 reaches the interior of the drift region 11a from the front surface of the semiconductor substrate S.

The drift region 11a includes an n-type first impurity diffusion region 15A formed around the bottom surface of the first trench 15 and an n-type second impurity diffusion region 16A formed around the bottom surface of the second trench 16a.

The first impurity diffusion region 15A is a region formed such that an n-type dopant such as phosphorus is diffused into the drift region 11a by ion implantation, or the like. The peripheral edge of the first impurity diffusion region 15A has a C-shape in section.

The second impurity diffusion region 16A is a region formed such that an n-type dopant such as phosphorus is diffused into the drift region 11a by ion implantation, or the like. The peripheral edge of the second impurity diffusion region 16A has a C-shape in section. The impurity concentration of the second impurity diffusion region 16A is higher than that of the first impurity diffusion region 15A.

In the semiconductor device 200 configured as above, the extending of a depletion layer is different between the MOSFET 1 and the MOSFET 2 due to difference of impurity concentration in the vicinity of the bottom portion of the trench. Since the MOSFET 2 has a high impurity concentration in the vicinity of the bottom portion of the trench, the depletion layer hardly extends, and thus the breakdown occurs in the MOSFET 2 earlier than that in the MOSFET 1.

At this time, since a breakdown current flows to the PN junction diode 3, breakdown resistance in MOSFET 1 can be improved. In addition, it is possible to realize the effect by only diffusing an impurity into the semiconductor substrate S, and fabricating costs of the device can be reduced.

The difference in the impurity concentration between the first impurity diffusion region 15A and the second impurity diffusion region 16A is arbitrary. However, in order to obtain more significantly the effect that the breakdown occurs in the MOSFET 2 earlier than that in the MOSFET 1, the impurity concentration of the second impurity diffusion region 16A is preferably 10 times or more than that of the first impurity diffusion region 15A.

The shape of the peripheral edge of each of the first impurity diffusion region 15A and the second impurity diffusion region 16A is not limited to a C-shape in which a part of a circle is cutout as exemplified in FIG. 2, and may be a shape in which a part of a rectangle is cutout.

By employing the C-shaped impurity diffusion region as illustrated in FIG. 2, it is possible to achieve the extending of the depletion layer uniform, and it is possible to improve the effect that the breakdown occurs in the MOSFET 2 earlier than that in the MOSFET 1.

In the semiconductor device 200, the lower end of the trench formed in the MOSFET 1 and the lower end of the trench formed in the MOSFET 2 are formed at the same location, but are not limited thereto, for example, the lower end of the trench formed in the MOSFET 2 may be formed on the upper side than the lower end of the trench formed in the MOSFET 1.

Figure 3:
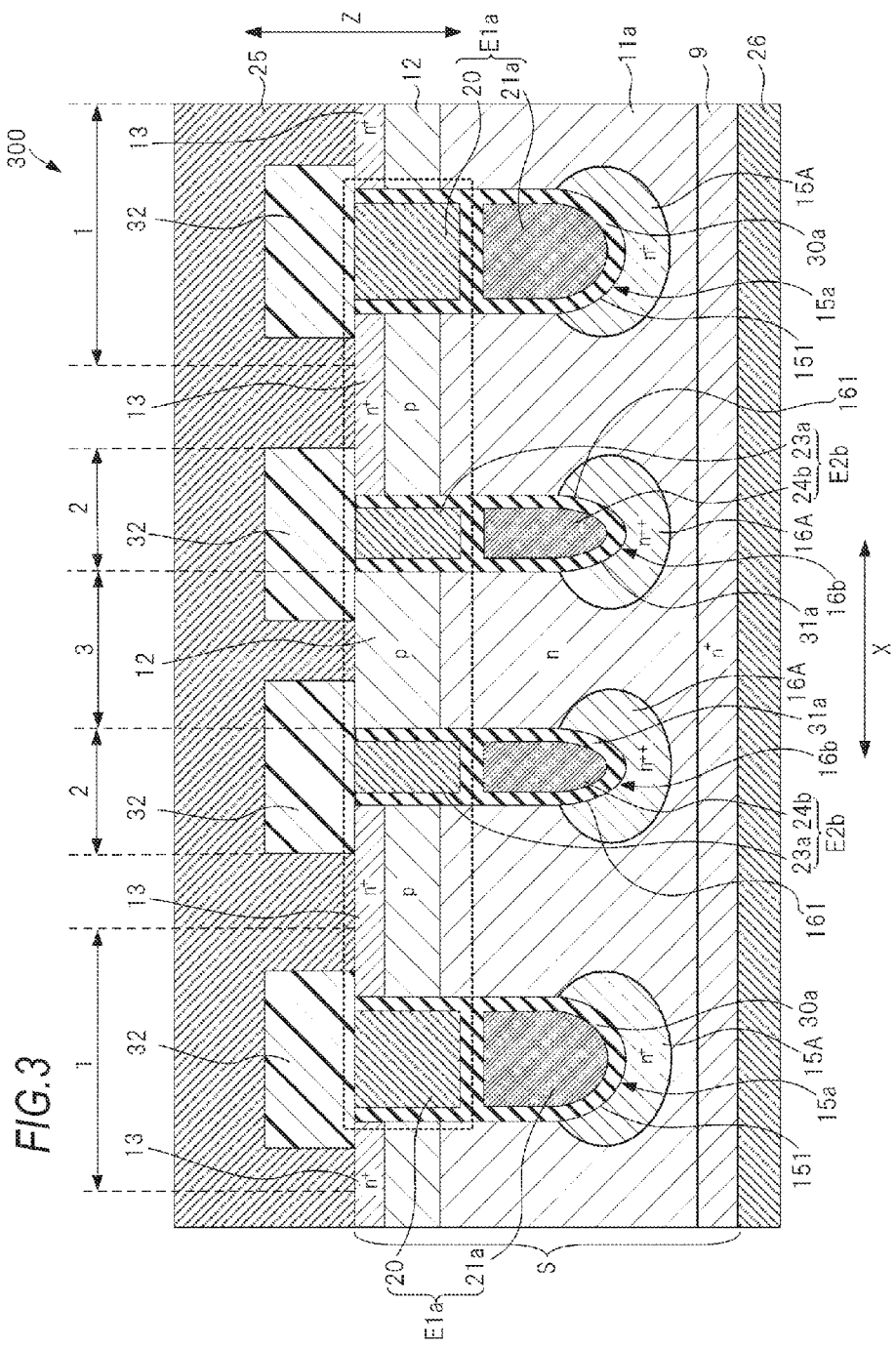
FIG. 3 is a schematic cross-sectional view partially illustrating a schematic configuration of a semiconductor device 300 according to an embodiment of this disclosure.

FIG. 3 is a schematic cross-sectional view illustrating a schematic configuration of a semiconductor device 300 according to an embodiment of this disclosure.

The semiconductor device 300 has the same configuration as the semiconductor device 200 except that the first trench 15 is changed into a first trench 15a, and the second trench 16a is changed into a second trench 16b. In FIG. 3, the same components as in FIG. 2 are denoted by same reference numerals.

The first trench 15a reaches the interior of the drift region 11a from the front surface of the semiconductor substrate S. The shape of the first trench 15a in section is a shape in which the bottom surface of the first trench 15 illustrated in FIG. 2 is changed into a curved surface protruding to a direction apart from the front surface of the semiconductor substrate S.

In the first trench 15a, the gate electrode 20 and a field plate electrode 21a are formed to configure a first conductive region E1a. The deposition, the function, and the material of the field plate electrode 21a are the same as those of the field plate electrode 21.

The shape of the field plate electrode 21a in section is a shape in which the bottom surface of the field plate electrode 21 illustrated in FIG. 2 is changed into a curved surface protruding to a direction apart from the front surface of the semiconductor substrate S.

In addition, a first insulating film 30a is formed in a portion in the first trench 15a excluding the first conductive region E1a. The material of the first insulating film 30a is the same as that of the first insulating film 30.

The second trench 16b reaches the interior of the drift region 11a from the front surface of the semiconductor substrate S. The shape of the second trench 16b in section is a shape in which the width of the second trench 16a illustrated in FIG. 2 in the direction X is narrowed and the bottom surface thereof is changed into a curved surface protruding to a direction apart from the front surface of the semiconductor substrate S.

In the second trench 16b, a gate electrode 23a and a field plate electrode 24b are formed to configure a second conductive region E2b. The function and the material of the gate electrode 23a are the same as those of the gate electrode 23. The width of the gate electrode 23a in the direction X is narrower than the gate electrode 23.

The shape of the field plate electrode 24b in section is a shape in which the width of the field plate electrode 24a illustrated in FIG. 2 in the direction X is narrowed and the bottom surface thereof is changed into a curved surface protruding to a direction apart from the front surface of the semiconductor substrate S.

In addition, a second insulating film 31a is formed in a portion in the second trench 16b excluding the second conductive region E2b. The material of the second insulating film 31a is the same as that of the second insulating film 31.

Figure 4:
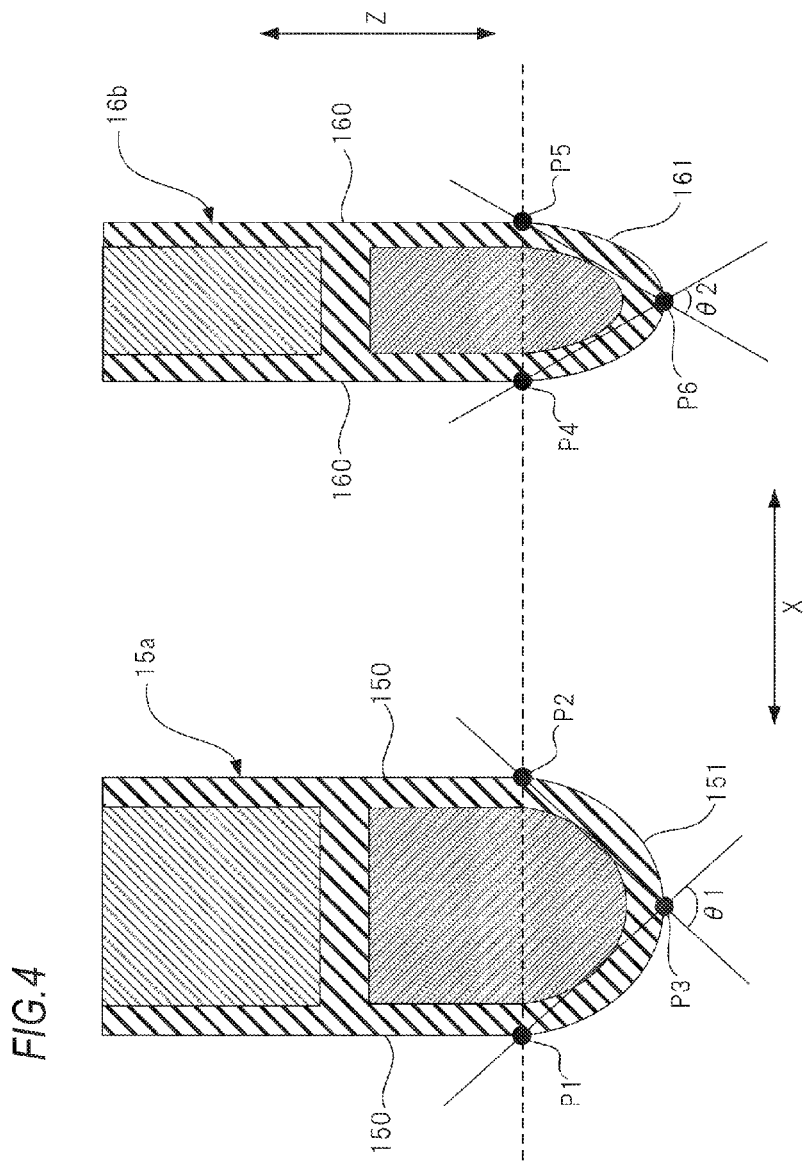
FIG. 4 is an enlarged view of an interior of a first trench 15a and a second trench 16b in the semiconductor device 300 illustrated in FIG. 3.

FIG. 4 is an enlarged view of the interior of the first trench 15a and the second trench 16b in the semiconductor device 300 illustrated in FIG. 3.

As illustrated in FIG. 4, the inner wall surface of the first trench 15a is configured by a side surface 150 parallel to the thickness direction Z, and a bottom surface 151 formed by a curved surface protruding to a direction apart from the front surface of the semiconductor substrate S.

In addition, the inner wall surface of the second trench 16b is configured by a side surface 160 parallel to the thickness direction Z, and a bottom surface 161 formed by a curved surface protruding to a direction apart from the front surface of the semiconductor substrate S. The broken line in FIG. 4 indicates a boundary between the side surface 150 (side surface 160) and the bottom surface 151 (bottom surface 161).

The sharpness of the bottom portion of the second trench 16b is larger than that of the bottom portion of the first trench 15a.

The reciprocal of an angle θ1 (1/θ1) formed such that, in the first trench 15a, a straight line connecting a boundary point P1 of the side surface 150 on the left side and the bottom surface 151, and a center point P3 which is the center of the bottom surface 151 in the direction X, and a straight line connecting a boundary point P2 of the side surface 150 on the right side and the bottom surface 151 and the center point P3 cross each other is defined as the sharpness of the bottom portion of the first trench 15a.

The reciprocal of an angle θ2 (1/θ2) formed such that, in the second trench 16b, a straight line connecting a boundary point P4 of the side surface 160 on the left side and the bottom surface 161, and a center point P6 which is the center of the bottom surface 161 in the direction X, and a straight line connecting a boundary point P5 of the side surface 160 on the right side and the bottom surface 161 and the center point P6 cross each other is defined as the sharpness of the bottom portion of the second trench 16b. As the numerical value of the sharpness is larger, the bottom portion of the trench becomes sharper.

As illustrated in FIG. 4, the angle θ2 indicating the sharpness of the bottom portion of the second trench 16b is smaller than the angle θ1 indicating the sharpness of the bottom portion of the first trench 15a. That is, the sharpness of the bottom portion of the second trench 16b is larger than that of the bottom portion of the first trench 15a.

As illustrated in FIG. 3, the bottom surface 151 of the first trench 15a is located in the first impurity diffusion region 15A formed in the drift region 11a. In addition, the bottom surface 161 of the second trench 16b is located in the second impurity diffusion region 16A formed in the drift region 11a.

In the semiconductor device 300 configured as above, the extending of a depletion layer is different between the MOSFET 1 and the MOSFET 2 due to difference of impurity concentration in the vicinity of the bottom portion of the trench. For this reason, the breakdown occurs in the MOSFET 2 earlier than that in the MOSFET 1. At this time, a breakdown current flows to the PN junction diode, thereby improving breakdown resistance in the MOSFET 1.

In addition, according to the semiconductor device 300, the bottom portion of the trench formed in the MOSFET 2 is sharper than the trench formed in the MOSFET 1. For this reason, it is possible to achieve a more difference in change of the extending of the depletion layer can be further changed between the MOSFET 1 and the MOSFET 2, and thus it is possible to improve the effect that the breakdown occurs in the MOSFET 2 earlier than that in the MOSFET 1.

In addition, according to the semiconductor device 300, the extending of the depletion layer can be changed according to the difference in shape of the bottom portion of the trench. Therefore, a condition of the impurity concentration in the first impurity diffusion region 15A and the second impurity diffusion region 16A can be obtained more freedom, thereby reducing the fabricating costs.

The semiconductor device described hitherto can be modified in various forms.

For example, in the semiconductor device 100 illustrated in FIG. 1, the trench formed in each of the two MOSFETs 2 between the MOSFETs 1 has the same structure each other, but one of the trenches formed in the two MOSFETs 2 may have the same structure as that of the MOSFETs 1.

Figure 5:
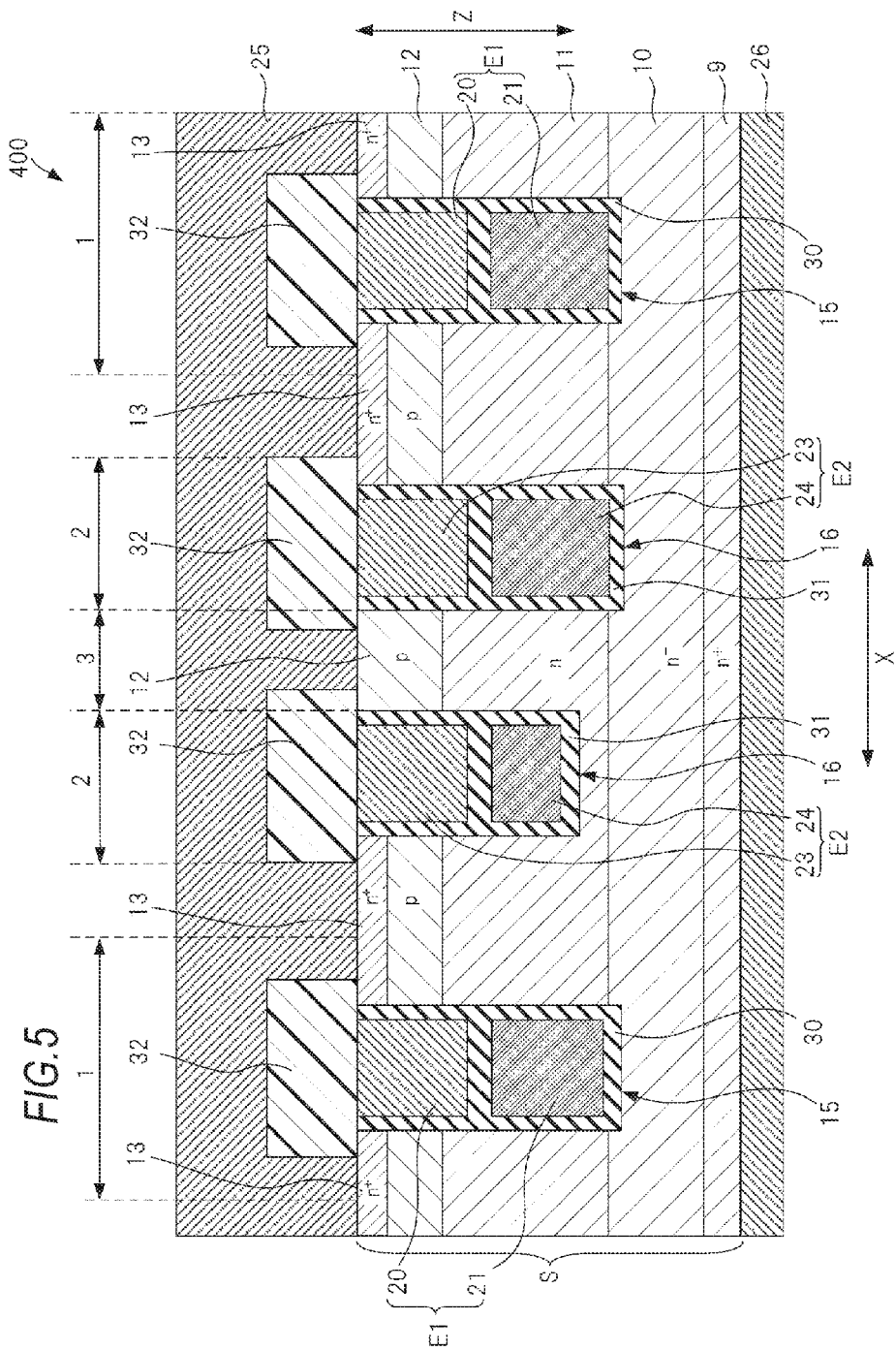
FIG. 5 is a schematic cross-sectional view partially illustrating a schematic configuration of a semiconductor device 400 according to an embodiment of this disclosure.

FIG. 5 is a schematic cross-sectional view illustrating a schematic configuration of a semiconductor device 400 according to an embodiment of this disclosure.

The semiconductor device 400 has a configuration in which the depth of the second trench 16 of the right MOSFET 2 has the same as that of the first trench 15, and the field plate electrode 24 of the right MOSFET 2 extends downward, with respect to the semiconductor device 100 illustrated in FIG. 1.

In the semiconductor device 400, the breakdown can occur in the left MOSFET 2 out of the two MOSFETs 2 earlier than that in the other MOSFET 1 or 2. As a result, it is possible to achieve a high withstand voltage.

In addition, in the semiconductor devices 200 and 300 illustrated in FIGS. 2 and 3, the second impurity diffusion region 16A located below the trench of each of the two MOSFETs 2 located between the MOSFETs 1 has the same impurity concentration. However, one of the two second impurity diffusion regions 16A may have the same impurity concentration as that of the first impurity diffusion region 15A.

For example, in the semiconductor device 200 illustrated in FIG. 2, the second impurity diffusion region 16A located in the vicinity of the bottom portion of the second trench 16*a* of the right MOSFET 2 may have the same impurity concentration as that of the first impurity diffusion region 15A.

For example, in the semiconductor device 300 illustrated in FIG. 3, the second impurity diffusion region 16A located in the vicinity of the bottom portion of the second trench 16*b* of the right MOSFET 2 may have the same impurity concentration as that of the first impurity diffusion region 15A.

With these configurations, the breakdown can occur in the left MOSFET 2 out of the two MOSFETs 2 earlier than that in the other MOSFET 1 or 2. As a result, it is possible to achieve a high withstand voltage.

In addition, the first trench 15*a* and the inner configuration thereof illustrated in FIG. 3 can be employed as the trench and the inner configuration thereof of the MOSFET 1 in the semiconductor device 100 illustrated in FIG. 1. Also, the second trench 16*b* and the inner configuration thereof illustrated in FIG. 3 can be employed as the trench and the inner configuration of the MOSFET 2 in the semiconductor device 100 illustrated in FIG. 1.

In this case, the bottom surface of the first trench 15*a* is located in the first epitaxial growth layer 10, and the bottom surface of the second trench 16*b* is located in the second epitaxial growth layer 11. According to this configuration, it is possible to improve the effect that the breakdown occurs in the MOSFET 2 earlier than that in the MOSFET 1, thereby achieving a high withstand voltage.

In above description, a transistor which the semiconductor devices 100 to 400 include is exemplified by the MOSFET. However, even in a case where a transistor is an IGBT, the same configuration can be applied to obtain the same effect.

Even in a case where the semiconductor devices 100 to 400 are configured such that the p-type impurity region and the n-type impurity region in the semiconductor substrate S are reversed, the similar effects can be obtained.

In the semiconductor devices 100 to 400 illustrated FIGS. 1 to 5, the MOSFET 1 in the right end or the left end may be removed. Even in this configuration, the breakdown can occur in the MOSFET 2 having a relatively high impurity concentration in the vicinity of the bottom surface of the trench earlier than that in the MOSFET 1, thereby improving breakdown resistance.

In the semiconductor devices 100 to 400, the field plate electrode included in the MOSFET 1 and the MOSFET 2 is not essential, and may be omitted.

For example, in a case where the field plate electrode is omitted in FIG. 2, the trench portion in a range enclosed by a broken line in FIG. 2 may be removed, and the trench and the impurity diffusion region may be united upward. The field plate electrodes 21 and 24*a* may be configured to have a function as a gate electrode.

Even in a case where the field plate electrode is omitted in FIG. 3, the trench portion in a range enclosed by a broken line in FIG. 3 may be removed, and the trench and the impurity diffusion region may be united upward. The field plate electrodes 21*a* and 24*b* may be configured to have a function as a gate electrode.

What is claimed is:

1. A semiconductor device comprising:
   three or more transistors, which are formed on a semiconductor substrate and arranged in one direction; and
   a PN junction diode, which is formed in a part of a region between the transistors formed on the semiconductor substrate,
   wherein a transistor includes:
      a trench, which is formed inwardly from a front surface of the semiconductor substrate; and
      a conductive region, which is configured by at least one conductor formed in the trench,
   wherein a first trench is a trench of the transistor which is not adjacent to the PN junction diode, and a second trench is a trench of one or both of two transistors which are adjacent to the PN junction diode,
   wherein a bottom surface of the first trench is formed in a semiconductor region of a first impurity concentration, and
   wherein a bottom surface of the second trench is formed in a semiconductor region of a second impurity concentration, which is higher than the first impurity concentration.

2. The semiconductor device according to claim 1, wherein the second impurity concentration is equal to or more than 10 times as high as the first impurity concentration.

3. The semiconductor device according to claim 1, wherein the semiconductor substrate includes a first epitaxial growth layer of the first impurity concentration formed on a substrate, and a second epitaxial growth layer of the second impurity concentration formed on the first epitaxial growth layer,
   wherein the bottom surface of the first trench is located in the first epitaxial growth layer, and
   wherein the bottom surface of the second trench is located in the second epitaxial growth layer.

4. The semiconductor device according to claim 1, wherein the bottom surface of the first trench is located in an impurity layer of a first conductivity type forming the semiconductor substrate, and
   wherein the impurity layer includes:

a first impurity diffusion region, which has the first conductivity type and the first impurity concentration, formed in the vicinity of the bottom surface of the first trench; and a second impurity diffusion region, which has the first conductivity type and the second impurity concentration, formed in the vicinity of the bottom surface of the second trench.

5. The semiconductor device according to claim 4, wherein a peripheral edge in the one direction of each of the first impurity diffusion region and the second impurity diffusion region is formed in a C-shape in a section.

6. The semiconductor device according to claim 1, wherein the bottom surface of the second trench has a larger sharpness than the bottom surface of the first trench.

* * * * *